United States Patent [19]
Kamejima et al.

[11] Patent Number: 5,165,086
[45] Date of Patent: Nov. 17, 1992

[54] MICROPROCESSOR CHIP USING TWO-LEVEL METAL LINES TECHNOLOGY

[75] Inventors: Shigehiro Kamejima, Ome; Yoshimune Hagiwara, Hachioji; Kouki Noguchi, Kokubunji; Minoru Ishii, Inagi; Tadahiko Nishimukai, Sagamihara; Hideo Nakamura; Haruo Koizumi, both of Tokyo; Hiroyuki Masuda, Fuchu, all of Japan

[73] Assignee: Hitachi, Ltd., Tokyo, Japan

[21] Appl. No.: 527,866

[22] Filed: May 24, 1990

Related U.S. Application Data

[63] Continuation of Ser. No. 323,146, Mar. 13, 1989, abandoned, which is a continuation of Ser. No. 828,716, Feb. 12, 1986, abandoned.

[30] Foreign Application Priority Data

Feb. 20, 1985 [JP] Japan ................. 60-30370
Mar. 15, 1985 [JP] Japan ................. 60-50502

[51] Int. Cl.$^5$ .................. G06F 15/20; G06F 1/00
[52] U.S. Cl. ................. 364/491; 364/488; 364/489; 364/490

[56] References Cited

U.S. PATENT DOCUMENTS

| | | | |
|---|---|---|---|
| 3,892,957 | 7/1975 | Bryant | 235/156 |
| 3,987,418 | 10/1976 | Buchanon | 364/200 |
| 4,319,396 | 3/1982 | Law et al. | 29/571 |
| 4,393,464 | 7/1983 | Knapp et al. | 395/800 |
| 4,447,881 | 5/1984 | Brantingham et al. | 364/488 |
| 4,467,409 | 8/1984 | Potash et al. | 395/800 |
| 4,568,961 | 2/1986 | Noto | 357/45 |
| 4,583,111 | 4/1986 | Early | 357/45 |
| 4,623,911 | 11/1986 | Pryor | 357/45 |
| 4,652,992 | 3/1987 | Mensch, Jr. | 364/200 |
| 4,742,019 | 5/1988 | Bechade | 357/41 |
| 4,750,026 | 6/1988 | Kuninobu et al. | 357/41 |
| 4,811,073 | 3/1989 | Kitamura et al. | 357/45 |
| 4,951,111 | 8/1990 | Yamamoto | 357/41 |

FOREIGN PATENT DOCUMENTS 58-143550 8/1983 Japan.
59-175148 10/1984 Japan.

OTHER PUBLICATIONS

Puri, Y. K., "Modified Weinburger Chip Image for Random Logic with Double Level Metallization", IBM Tech. Disclosure, vol. 19, No. 6, Nov. 1976, pp. 2148–2149.
Cook et al., Logic Circuit Design Methology and Applications, Apr. 4, 1979, pp. 333–346.
Feller et al., A 1.25—Micron CMOS-SOS DLM Optimized Standard Cell Technology, Jun. 21–22, 1984, pp. 290–297.
Song et al., Power Distribution Techniques for VLSI Circuits, Jan. 23, 1984, pp. 45–52.
Kang et al., Gate Matrix Layout of Random Control Logic in a 32-Bit CMOS CPU chip Adaptable to Evolve Logic Design, Jan. 1983, pp. 18–29.

*Primary Examiner*—Gareth D. Shaw
*Assistant Examiner*—John Q. Chavis
*Attorney, Agent, or Firm*—Antonelli, Terry, Stout & Kraus

[57] ABSTRACT

A microprocessor chip including a ROM portion for storing a microprogram, an execution unit portion for executing an arithmetic operation and random logic circuits disposed between the ROM portion and the execution unit portion. Two-level metal lines technology is used for supplying power for grounding and for providing input/output interconnect lines for the random logic circuits.

21 Claims, 6 Drawing Sheets

MICROPROCESSOR CHIP USING TWO-LEVEL METAL LINES TECHNOLOGY

This is a continuation of application Ser. No. 07/323,146, filed Mar. 13, 1989, which is a continuation of application Ser. No. 06/828,716, filed Feb. 12, 1986 both now abandoned.

BACKGROUND OF THE INVENTION

The present invention relates to a chip layout most suitable for logic LSI circuits such as microprocessors.

Generally speaking, advancement in fine pattern technology for manufacturing semiconductor LSI circuits has enabled high density packing. Also, designs for chip layout have been introduced in order to make signal line routing as short as possible for high speed operation. An example of prior art technology based on the above technical concept can be found in the layout method for MOS-LSI microprocessors proposed in U.S. Pat. No. 3,987,418, as shown in FIG. 1. In the figure, each rectangular frame (112 to 152) represents a circuit block having a unitary function. Each block is laid out in a high density packing along a signal flow represented by arrows. This prior art method, however, is accompanied with a drawback that if an additional circuit function is required for the microprocessor to improve its performance, a complete change in layout is needed because of the lack of any space in the layout area. As an example, a microprocessor circuit designed by the present inventor is shown in FIG. 2, which circuit includes the functions of the prior art microprocessor shown in FIG. 1. This microprocessor circuit shown in FIG. 2 has three additional circuits not included in the microprocessor of FIG. 1, i.e., O-C 206 (Operand-Cache), I-C 207 Instruction-Cache) and micro-ROM 211 (Microprogram ROM}. These additional circuits are used for improving the operation speed of the microprocessor.

With the layout method shown in FIG. 1, the additional circuits 206, 207 and 211 of FIG. 2 cannot be introduced unless a complete change in layout is performed, because no space in the layout area is left.

SUMMARY OF THE INVENTION

It is an object of the present invention to solve the above prior art problem and provide a fundamental layout. which is usable in common to general microprocessors to permit changing or adding a circuit function for the microprocessor.

According to the basic aspect of the present invention, a circuit whose function is relatively fixed and rarely subjected to change, and a circuit whose function is prone to change or addition, are separately laid out relative to the perpendicular direction or lateral direction of a chip, to thereby realize a versatile, fundamental layout achieving the above object of the invention.

DESCRIPTION OF THE PREFERRED EMBODIMENTS

An embodiment of the present invention shown in FIG. 3 will be described with reference to FIG. 2 and in comparison with the conventional layout of FIG. 1.

Figure 1:
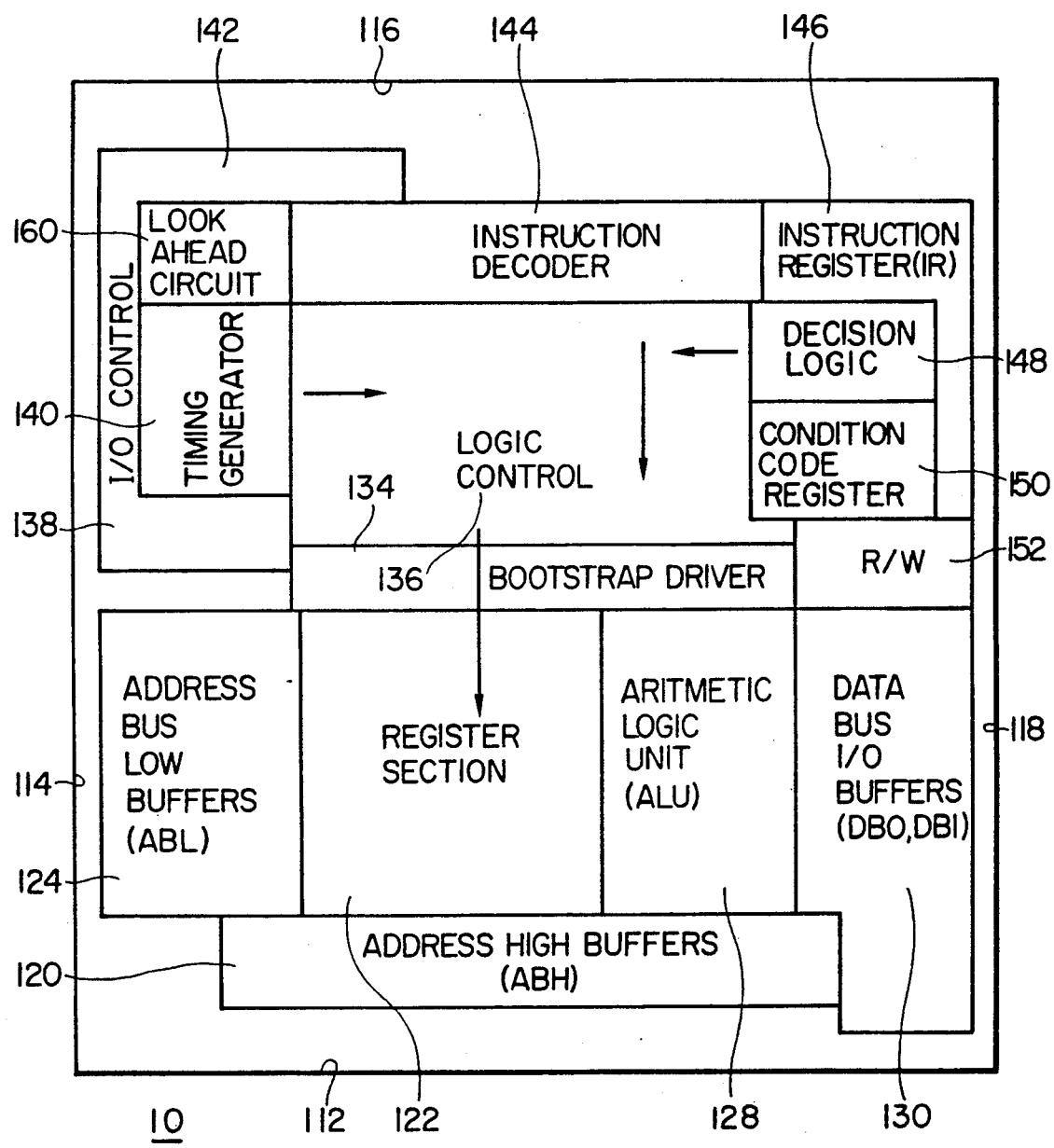
FIG. 1 shows an example of the overall layout of a conventional microprocessor.
Figure 2:
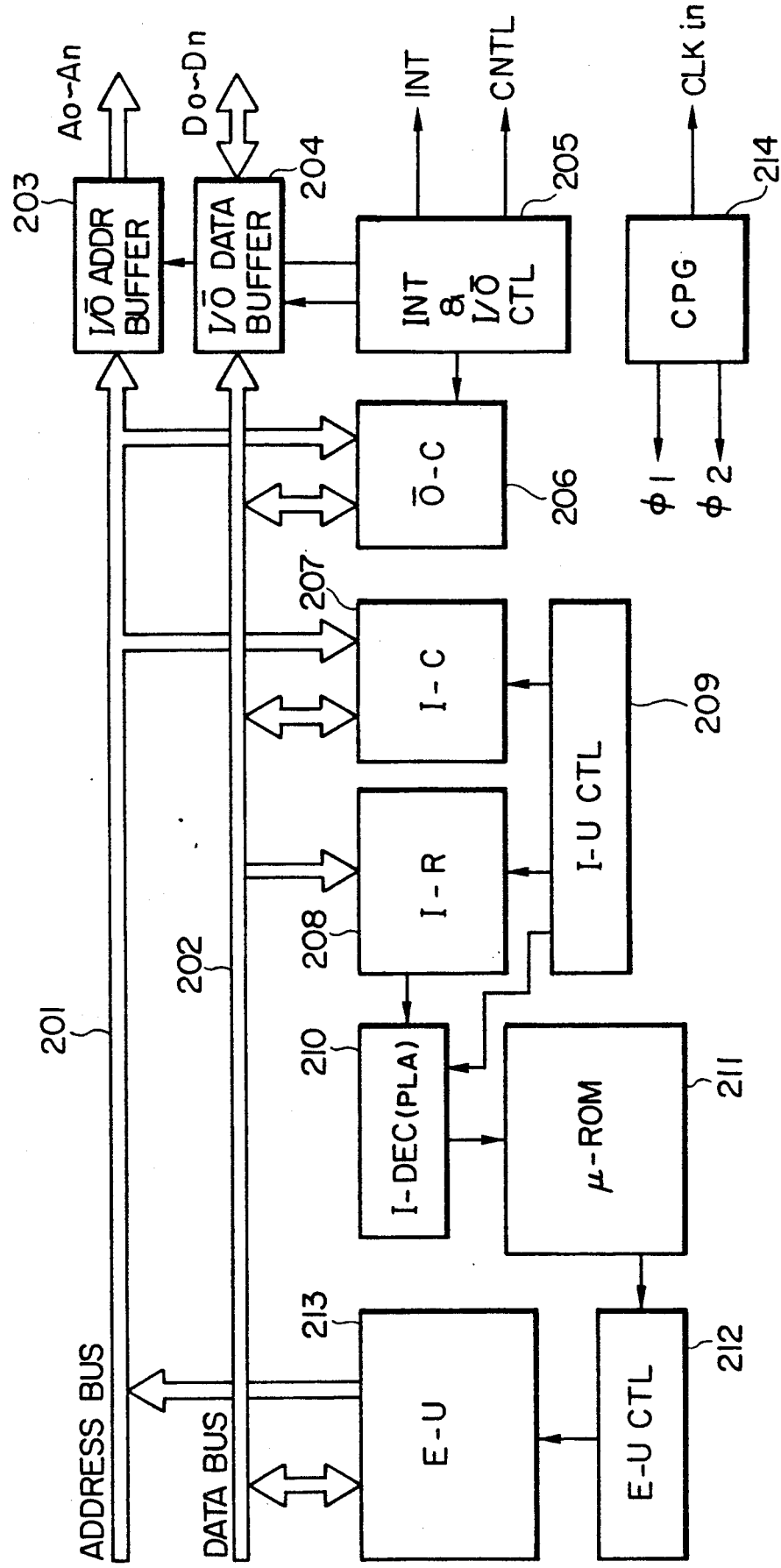
FIG. 2 is a block diagram showing the microprocessor designed by the present inventor.
Figure 3:
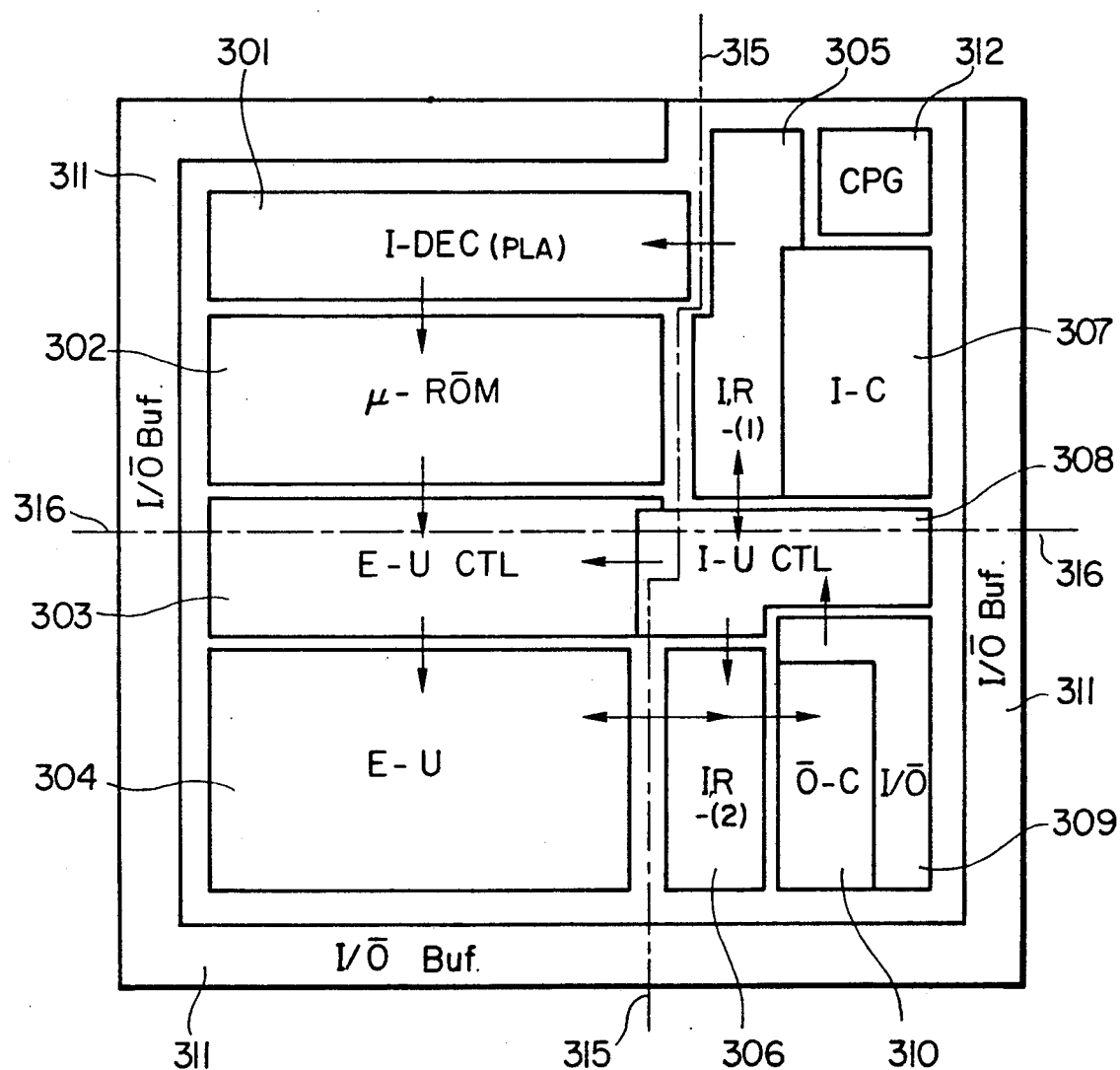
FIG. 3 shows an example of the overall layout of the microprocessor of FIG. 2.

FIG. 3 shows a microprocessor layout according to the embodiment of the present invention, and FIG. 2 shows the circuit arrangement of the microprocessor of FIG. 2. Referring to FIG. 2, the microprocessor layout of FIG. 3 (and the conventional microprocessor layout of FIG. 1) will first be described. In FIG. 2, almost all of the circuit blocks are connected to an address bus 201 and a data bus 202, both operating as an internal bus. An address buffer 203 and a data buffer 204, both functioning as an input-output buffer, correspond to layout portions 311 in FIG. 3 (and to layout portions 124, 120 and 130 in FIG. 1). An external signal controller 205 in FIG. 2 corresponds to a layout portion 309 in FIG. 3 (and to layout portions 138, 142 and 152 in FIG. 1). Cache memories 206 and 207 in FIG. 2 constructed of CAMs (Content Addressable Memory) correspond to layout portions 310 and 307, respectively in FIG. 3 (and have no corresponding layout portion in FIG. 1). An instruction register 208 and an instruction unit controller 209 in FIG. 2 correspond to layout portions 305 and 306, and 308, respectively in FIG. 3 (and to layout portions 146 and 150, and 148 and 142, respectively in FIG. 1). An instruction decoder 210 in FIG. 2 corresponds to a layout portion 301 in FIG. 3 (and to a layout portion 144 in FIG. 1). The microprogram ROM 211 in FIG. 2 corresponds to a layout portion 302 in FIG. 3 (and has no corresponding layout portion in FIG. 1). An execution unit 213 and an execution unit controller 212 in FIG. 2 correspond to layout portion 304 and 303, respectively in FIG. 3 (and to layout portions 122, 128 and 134, and 136, respectively in FIG. 1). A clock pulse generator 214 in FIG. 2 corresponds to a layout portion 312 in FIG. 3 (and to a layout portion 140 in FIG. 1). The correspondence between the circuit blocks and their layout portions in FIGS. 1, 2 and 3 are summarized in Table 1.

TABLE 1

|  | FIG. 3 | FIG. 2 | FIG. 1 |
| --- | --- | --- | --- |
| Instruction Decoder (PLA) | 301 | 210 | 144 |
| Micro Program Memory (ROM) | 302 | 211 | none |
| Execution Unit Controller | 303 | 212 | 136 |
| Execution Unit | 304 | 213 | 122 128, 134 |
| Instruction Register | 305, 306 | 208 | 146, 150 |
| Instruction Cache (CAM) | 307 | 207 | none |
| Instruction Unit Controller | 308 | 209 | 148, 142 |
| External Signal | 309 | 205 | 138, |

TABLE 1-continued

| | FIG. 3 | FIG. 2 | FIG. 1 |
|---|---|---|---|
| Controller | | | 142, 152 |
| Operand Cache (CAM) | 310 | 206 | none |
| Input-Output Buffer | 311 | 203, 204 | 124 120, 130 |
| Clock Pulse Generator | 312 | 214 | 140 |

There are two main features of the layout of the invention shown in FIG. 3, distinctive from the conventional layout shown in FIG. 1. The first feature resides in dividing the whole layout area into right and left portions which are shown in FIG. 3 as being separated by a one-dot chain line 315. The second feature resides in dividing the whole layout portion into upper and lower portions relative to the controllers 303 and 308 which are shown as separated by a one-dot line 316. With the first feature, the circuits whose functions are rarely changed (i.e., the instruction decoder 301, microprogram memory (ROM) 302, execution unit controller 303, execution unit 304), are laid out on the left side of the one-dot chain line 315. On the other hand, the circuits whose functions are prone to change or addition (i.e., the circuit blocks 305 to 308 in a process controller system, and circuit blocks 309 and 310 in an input-output controller system), are laid out on the right side of the one dot-chain line 315. One of the merits obtained from this layout is that the layout portions on both right and left sides of the one-dot chain line 315 are not mutually influenced, thereby enabling performance by both layouts completely independently from each other. Furthermore, the whole chip layout is completed in such a way that first the circuit layout on the left side is carried out, and thereafter the circuit layout on the right side is carried out, the layout area to be used on the right side of the one-dot chain line 315 varying with the intended performance of a microprocessor. Thus, very simple layout policy, easy design, and short time for development are possible. With the second feature, the execution unit controller 303 and instruction unit controller 308 (external signal controller 309 may be included) are mainly constructed of random logic circuits, so that it is not necessary to take substantial consideration of the form of the layout patterns for these controllers. However, the other circuits (301 to 312, except 303 and 308 or 309), i.e., regular structure circuits such as a register, arithmetic operation circuit, ROM and PLA (Programmable Logic Array), should preferably be laid out in the form of a regular structure to make the layout area smaller. In this case since each regular structure circuit has a different layout area, it is necessary to adjust the whole layout while laying out the regular structure circuits. According to the layout of the present invention of FIG. 3, the whole layout is achieved by properly changing a form of layout patterns so as to lay out the controllers 303 and 308 along the central one-dot chain line 316 as described above. With such a layout, each regular structure circuit can be relatively freely laid out on both upper and lower portions divided by the one-dot chain line 316. Thus, it is advantageous in that easy layout design and short time for development are possible.

According to the layout of the present invention, addition or change of a circuit function is readily performed, the form of layout patterns for the regular structure logic circuit is relatively free, and the whole chip layout can be developed with ease in a relatively short time.

Conventional micro-programmed logic LSI circuits, such as microprocessors, have been constructed in a random form by manually laying out a controller (represented by 303 in FIG. 3), which decodes microprograms stored in ROMs and generates control signals for an execution unit. It has been heretofore common to consume considerable man power in the layout of the controller. However, with the development of computer utility technology and process technology, it is desirable to apply an automatic layout process to the layout of such as a controller. The conventional automatic layout has paid no attention to the automatic layout of such as a controller. Thus, it has become necessary to propose a new layout of the controller suitable for an automatic layout.

An automatic layout is carried out using multi-layer metal interconnection techniques and using standard cells (standard gates). A power supply line and ground line to be formed with an automatic layout, are laid out into a logic unit, using a lower metal wire. The line width is not so large because of restrictions on the layout area. Thus, in view of a possible change in power supply voltage, it is not possible to use a substantially long row of standard cells. To make the layout area smaller, it is noted that there is a tendency for the layout area to become minimum when the numbers of lower and upper metal lines to be laid out are generally equal to each other.

The micro-programmed logic LSI circuit is constructed of a memory portion for storing microprograms, an execution unit for executing data processing, and an execution unit controller for generating control signals for the execution unit by decoding the microprogram. Of these elements, the memory portion and execution unit are constructed of regular structure circuits, thereby enabling a layout of a regular structure. However, the execution unit controller is constructed of a lesser number of regular structure circuits, thus raising an obstacle in performing a layout.

One approach to make the layout of the controller in a regular pattern, is to use a PLA (Programmable Logic Array). A CPU chip described in IEEE Journal of Solid-State circuits, VOL. SC-16, No. 5, October 1981, pp 537 to 541, employs such an approach. Use of a PLA, however, is accompanied with an inferior operation speed to that of a random logic circuit.

An example of the layout using random gate circuits which give prominence to the operation speed of the controller, is to a 16 bit microcomputer MC68010, described in IEEE Micro, June 1983, pp 24 to 39. In this case, however, the random logic circuit portion is achieved by means of a manual layout, without taking account of the number of layout processes.

The present invention further provides a layout method capable of attaining a regular logic structure of a random logic gate formed in a logic LSI circuit, without degrading the circuit performance.

A random logic circuit is constructed of a combination of logic gates such a NANDs and NORs. Each logic gate is provided with a power supply line and ground line to be laid out beforehand. The widths of these lines are not so wide due to restriction of layout area. Therefore, in order to alleviate influence by a change in power supply voltage, it is necessary not to make the line length too long. In addition, to make the layout area minimum, it is effective to use the same number of lines to be laid out both in the perpendicular and lateral directions. In the present invention, a layout method meeting the above two requirements is provided.

Figure 4:
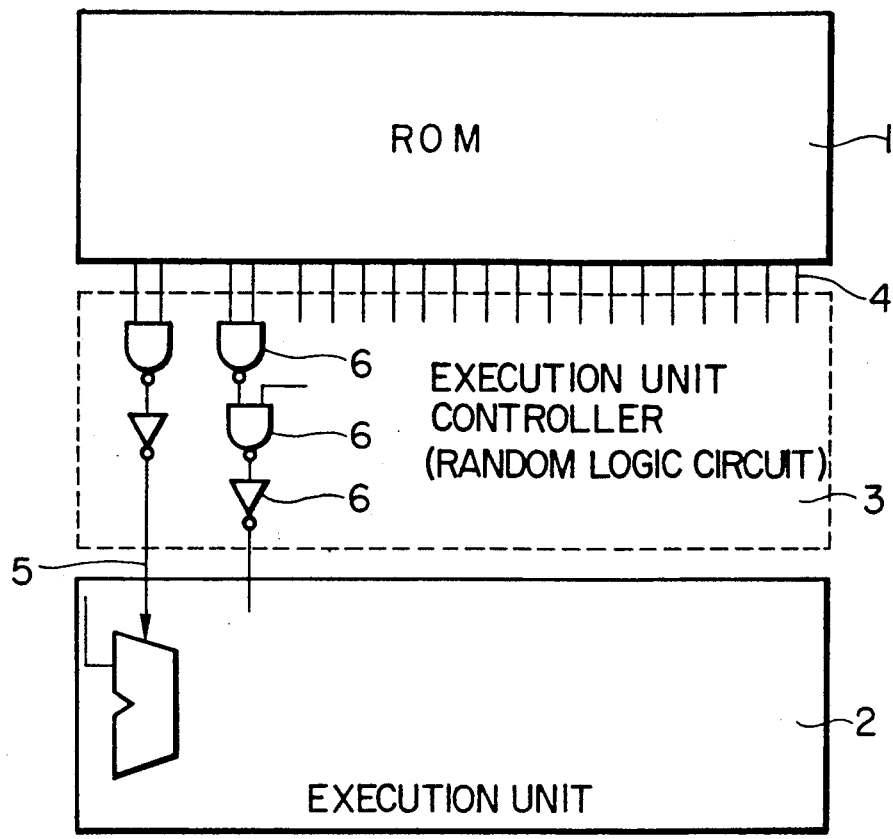
FIG. 4 schematically shows a logic LSI circuit for microprogram control.

FIG. 4 shows an example of a micro-programmed logic LSI circuit. ROM 1 is a memory portion for storing microprograms. An execution unit 2 is a portion for executing arithmetic operations for data. This execution unit 2 constructed of a data storage circuit (a register and an arithmetic logic unit (ALU)). An execution unit controller 3 is a portion for decoding microprograms 4 and generating control signals for the execution unit 2, which portion is constructed of a combination of logic gate units 6. An embodiment of the layout method of the present invention applied to the logic LSI circuit constructed as above, will now be described.

Figure 5:
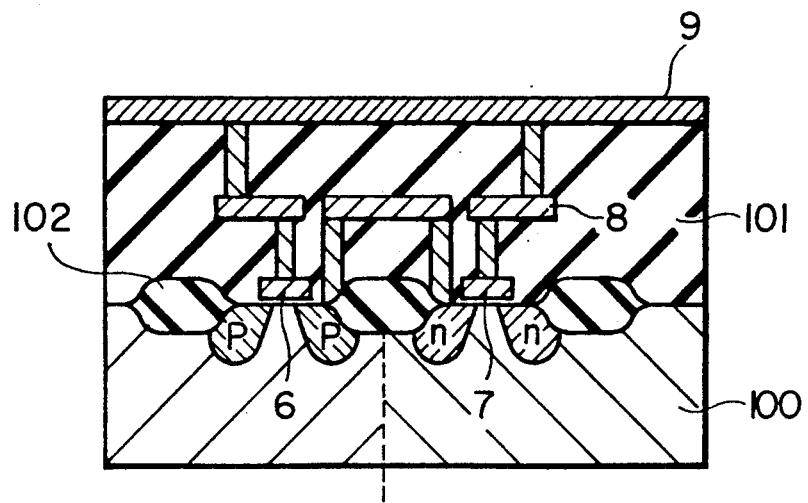
FIG. 5 is a cross-sectional view showing the structure of a device of a CMOS circuit used in the present invention.

An example of the structure of a device using multilayer metal interconnection and manufactured by C-MOS processes is shown in FIG. 5. A logic gate circuit is constructed of a combination of a p-channel transistor 6 and an n-channel transistor 7 formed on a substrate 100. In the device using the two-layer metal interconnection structure shown in FIG. 5, the lines of the circuit are laid out by using a lower metal line 8 and an upper metal line 9. Reference numerals 101 and 102 represent insulation layers.

Figure 6:
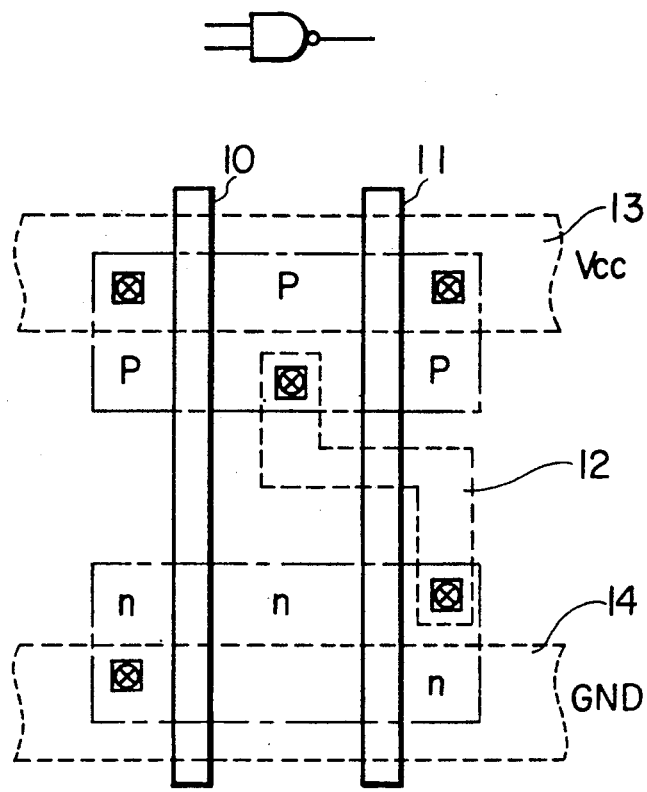
FIG. 6 shows the layout of a two-input NAND gate, which is one example of a logical gate used in the present invention.

An example of a layout is shown in FIG. 6, wherein a two-input NAND gate is constructed by using the device structure of FIG. 5. Two inputs are applied to gates 10 and 11, respectively. The output is applied onto a lower metal line 12. A power supply line 13 and a ground line 14 are laid out by using lower metal lines. A contact area is represented by a symbol x. As seen from the above description and FIG. 6, upper metal lines are not used within the area of the logic gate unit, so that upper metal lines can freely be passed or laid out on the logic gate unit.

Figure 7:
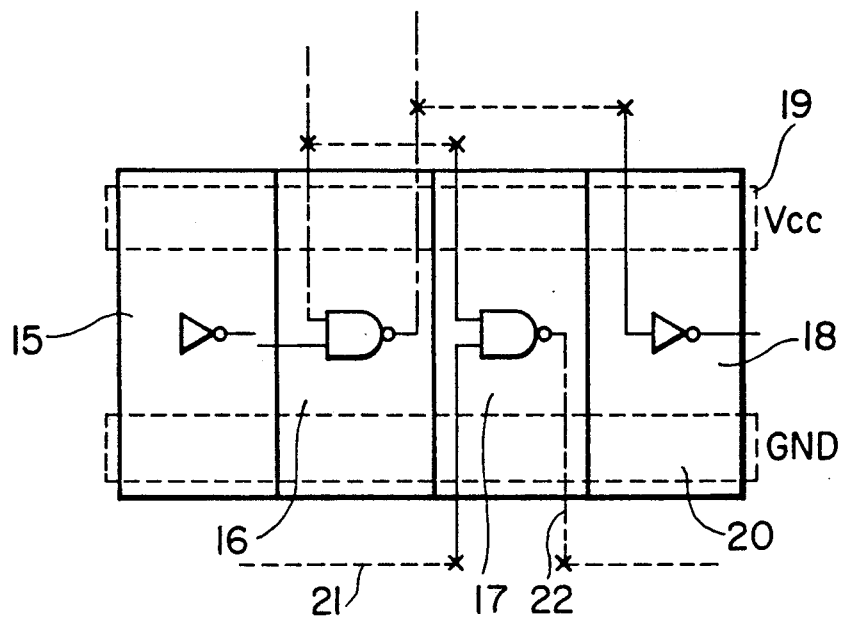
FIG. 7 shows the layout of a random logic made of a logic gate array and used in the present invention.

An example of a logic circuit constructed of a combination of the above-described logic gate units is shown in FIG. 7. Merely disposing logic gate units 15, 16, 17 and 18 side by side and across the power supply line 19 and ground line 20 ensures proper connection alignment between the logic gate units and the lines. The inputs and outputs of the logic circuit can be interconnected by laying out, on the juxtaposed logic gate units, the lower metal line 21 in the direction parallel to the power supply and ground lines, and the upper metal line 22 in the direction perpendicular to the power supply and ground lines. As above, it is possible to construct a random logic circuit by forming a row of standard cells or logic gate units and laying out upper and lower metal lines.

Figure 8:
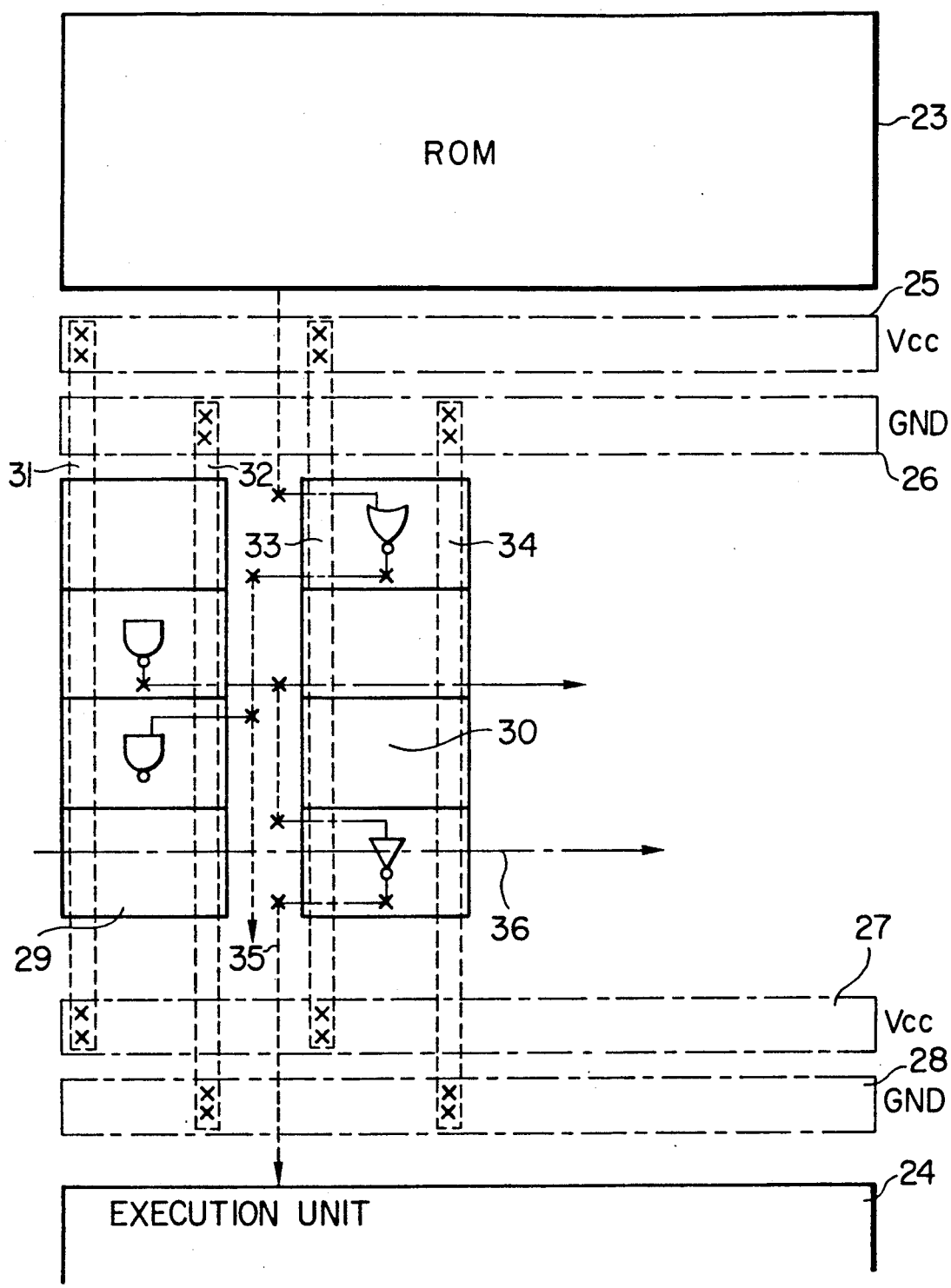
FIG. 8 shows an example of the layout of a controller of the logic LSI circuit for microprogram control, to which controller the present invention is applied.

FIG. 8 shows an example of a layout of the controller to which the layout method of the present invention is applied. Between a ROM 23 storing microprograms and an execution unit 24, the random logic circuit of the controller is laid out. The interconnection between the logic gate units of the controller is achieved through two-layer metal interconnection. Power supply to the controller is achieved by laying out main power supply lines 25 and 27 and main ground lines 26 and 28, in the direction parallel to the lateral direction of the ROM 23 and execution unit 24, using diffusion lines or upper metal lines. These lines have a line width sufficiently wide such that the effect of a change in power supply does not become substantial. Rows of standard cells 29 and 30 are disposed in the direction perpendicular to that of the main power supply lines and main ground lines. The power supply lines 31 and 33 and ground lines 32 and 34 for the rows of the standard cells, are achieved by lower metal lines and respectively connected to the main power supply lines and main ground lines. The numeral 35 indicates lower metal lines and the numeral 36 indicates the upper metal lines. With such a construction, it is possible to define the length of the power supply line and ground line for the rows of standard cells, based on the distance between the main power supply lines 25 and 27 and the main ground lines 28 and 26. The controller area extends in the lateral direction parallel to the lateral direction of the ROM 23 and execution unit 24. Therefore, the number of lines to be laid out between the rows of standard cells using such as lower metal lines 35 becomes substantially equal to the number of lines to be laid out on the rows of standard cells.

According to the present invention, it is possible to lay out a random logic circuit in the form of a row of standard cells, and define the length of a power supply line and ground line to be laid out within the row of standard cells. Furthermore, it is possible to make substantially equal the numbers of lines to be laid out on the rows of standard cells in both perpendicular and lateral directions. Therefore, while laying out a controller in the form of a row of standard cells, it is advantageous in that the layout method of the present invention is not susceptible to influence from a change in power supply voltage and can make the layout area small.

We claim:

1. A semiconductor logic integrated circuit chip using two-level metal lines comprising:
   (1) a first portion having a substantially rectangular form;
   (2) a second portion having a substantially rectangular form; and
   (3) a third portion coupled to said first portion and said second portion and having a substantially rectangular form,
   wherein said third portion is disposed between said first portion and said second portion, and
   wherein said third portion includes:
      (a) a first main power supply line and a first main ground line disposed substantially in parallel to one side of the substantially rectangular form of said first portion;
      (b) a second main power supply line and a second main ground line disposed substantially in parallel to one side of the substantially rectangular form of said second portion;
      (c) a sub-power supply line connected to said first main power supply line and said second main power supply line and disposed substantially perpendicularly to said first main power supply line and said second main power supply line;
      (d) a sub-ground line connected to said first main ground line and said second main ground line and disposed substantially perpendicularly to said first main ground line and said second main ground line; and
      (e) a plurality of logic gate circuits disposed between said sub-power supply line and said sub-ground line,
   wherein said sub-power supply line and said sub-ground line are formed of lower metal lines of two-level metal lines,
   wherein said first main power supply line, said second main power supply line, said first main ground line, and said second main ground line are formed of diffusion lines or upper metal lines of said two-level metal lines, wherein a plurality of interconnect lines are provided to connect said logic gate circuits to one another and to said first and second portions, in a predetermined manner, for inputting and outputting signals to and from said logic gate circuits, wherein said interconnect lines are formed of other lower metal lines of said two-level metal lines disposed substantially perpendicularly to said main power supply lines and to said main ground lines and formed of other upper metal lines of said two-level metal lines disposed substantially in parallel to said main power supply lines and to said main ground ;lines, wherein said first portion is a memory portion for storing a microprogram therein, and wherein said logic gate circuits are connected to said sub-power supply line and said sub-ground line so that power for said logic gate circuits is supplied from said sub-power supply line and said sub-ground line.

2. A semiconductor logic integrated circuit chip using two-level metal lines comprising:
(1) a first portion having a substantially rectangular form;
(2) a second portion having a substantially rectangular form; and
(3) a third portion coupled to said first portion and said second portion and having a substantially rectangular form, wherein said third portion is disposed between said first portion and said second portion, and wherein said third portion includes:
(a) a first main power supply line and a first main ground line disposed substantially in parallel to one side of the substantially rectangular form of said first portion;
(b) a second main power supply line and a second main ground line disposed substantially in parallel to one side of the substantially rectangular form of said second portion;
(c) a sub-power supply line connected to said first main power supply line and said second main power supply line and disposed substantially perpendicularly to said first main power supply line and said second main power supply line;
(d) a sub-ground line connected to said first main ground line and said second main ground line and disposed substantially perpendicularly to said first main ground line and said second main ground line; and
(e) a plurality of logic gate circuits disposed between said sub-power supply line and said sub-ground line, wherein said sub-power supply line and sub-ground line are formed of lower metal lines of two-level metal lines, wherein said first main power supply line, said second main power supply line, said first main ground line, and said second main ground line are formed of diffusion lines or upper metal lines of said two-level metal lines, wherein a plurality of interconnect lines are provided to connect said logic gate circuits to one another and to said first and second portions, in a predetermined manner, for inputting and outputting signals to and from said logic gate circuits.

wherein said interconnect lines are formed of other lower metal lines of said two-level metal lines disposed substantially perpendicularly to said main power supply lines and to said main ground lines and formed of other upper metal lines of said two-level metal lines disposed substantially in parallel to said main power supply lines and to said main ground lines, wherein said second portion is an execution unit for executing an arithmetic operation, and wherein said logic gate circuits are connected to said sub-power supply line and said sub-ground line so that power for said logic gate circuits is supplied from said sub-power supply line and said sub-ground line.

3. A semiconductor logic integrated circuit chip using two-level metal lines comprising:
(1) a first portion having a substantially rectangular form;
(2) a second portion having a substantially rectangular form; and
(3) a third portion coupled to said first portion and said second portion and having a substantially rectangular form, wherein said third portion is disposed between said first portion and said second portion, and wherein said third portion includes:
(a) a first main power supply line and a first main ground line disposed substantially in parallel to one side of the substantially rectangular form of said first portion;
(b) a second main power supply line and a second main ground line disposed substantially in parallel to one side of the substantially rectangular form of said second portion;
(c) a sub-power supply line connected to said first main power supply line and said second main power supply line and disposed substantially perpendicularly to said first main power supply line and said second main power supply line;
(d) a sub-ground line connected to said first main ground line and said second main ground line and disposed substantially perpendicularly to said first main ground line and said second main ground line; and
(e) a plurality of logic gate circuits disposed between said sub-power supply line and said sub-ground line, wherein said sub-power supply line and said sub-ground line are formed of lower metal lines of two-level metal lines, wherein said first main power supply line, said second main power supply line, said first main ground line, and said second main ground line are formed of diffusion lines or upper metal lines of said two-level metal lines, wherein a plurality of interconnect lines are provided to connect said logic gate circuits to one another and to said first and second portions, in a predetermined manner, for inputting and outputting signals to and form said logic gate circuits, wherein said interconnect lines are formed of other lower metal lines of said two-level metal lines disposed substantially perpendicularly to said main power supply lines and to said main ground lines and formed of other upper metal lines of said two-level metal lines disposed substantially in parallel to said main power supply lines and to said main ground lines, wherein said first portion is a memory portion for storing a microprogram therein, said second portion is an execution unit for executing an arithmetic operation, and said third portion is an execution unit controller for generating control signals for said execution unit by decoding said microprogram stored in said memory portion, and wherein said logic gate circuits are connected to said sub-power supply line and said sub-ground line so that power for said logic gate circuits is supplied from said sub-power supply line and said sub-ground line.

4. A semiconductor logic integrated circuit chip using two-level metal lines comprising:

(1) a first portion having a substantially rectangular form;

(2) a second portion having a substantially rectangular form; and (3) a third portion coupled to said first portion and said second portion and having a substantially rectangular form, wherein said third portion is disposed between said first portion and said second portion, and wherein said third portion includes:

(a) a first main power supply line and a first main ground line disposed substantially in parallel to one side of the substantially rectangular form of said first portion;

(b) a second main power supply line and a second main ground line disposed substantially in parallel to one side of the substantially rectangular form of said second portion;

(c) a sub-power supply line connected to said first main power supply line and said second main power supply line and disposed substantially perpendicularly to said first main power supply line and said second main power supply line;

(d) a sub-ground line connected to said first main ground line and said second main ground line and disposed substantially perpendicularly to said first main ground line and said second main ground line; and (e) a plurality of logic gate circuits disposed between said sub-power supply line and said sub-ground line, wherein said sub-power supply line and said sub-ground line are formed of lower metal lines of two-level metal lines, wherein said first main power supply line, said second main power supply line, said first main ground line, and said second main ground line are formed of diffusion lines, wherein a plurality of interconnect lines are provided to connect said logic gate circuits to one another and to said first and second portions, in a predetermined manner, for inputting and outputting signals to and from said logic gate circuits, wherein said interconnect lines are formed of other lower metal lines of said two-level metal lines disposed substantially perpendicularly to said main power supply lines and to said main ground lines and formed of other upper metal lines of said two-level metal lines disposed substantially in parallel to said main power supply lines and to said main ground lines, and wherein said logic gate circuits are connected to said sub-power supply line and said sub-ground line so that power for said logic gate circuits is supplied from said sub-power supply line and said sub-ground line.

5. A microprocessor using two-level metal lines comprising:

(1) a first portion having a substantially rectangular form;

(2) a second portion having a substantially rectangular form; and (3) a third portion coupled to said first portion and said second portion and having a substantially rectangular form, wherein said third portion is disposed between said first portion and said second portion, and wherein said third portion includes:

(a) a first main power supply line and a first main ground line disposed substantially in parallel to one side of the substantially rectangular form of said first portion;

(b) a second main power supply line and a second main ground line disposed substantially in parallel to one side of the substantially rectangular form of said second portion;

(c) a sub-power supply line connected to said first main power supply line and said second main power supply line and disposed substantially perpendicularly to said first main power supply line and said second main power supply line;

(d) a sub-ground line connected to said first main ground line and said second main ground line and disposed substantially perpendicularly to said first main ground line and said second main ground line; and (e) a plurality of logic gate circuits disposed between said sub-power supply line and said sub-ground line, wherein said sub-power supply line and said sub-ground line are formed of lower metal lines of two-level metal lines, wherein said first main power supply line, said second main power supply line, said first main ground line, and said second main ground line are formed of diffusion lines or upper metal lines of said two-level metal lines, wherein a plurality of interconnect lines are provided to connect said logic gate circuits to one another and to said first and second portions, in a predetermined manner, for inputting and outputting signals to and from said logic gate circuits, wherein said interconnect lines are formed of other lower metal lines of said two-level metal lines disposed substantially perpendicularly to said main power supply lines and to said main ground lines and formed of other upper metal lines of said two-level metal lines disposed substantially in parallel to said main power supply lines and to said main ground lines, and wherein said logic gate circuits are connected to said sub-power supply line and said sub-ground line so that power for said logic gate circuits is supplied from said sub-power supply line and said sub-ground line.

6. A semiconductor logic integrated circuit chip using two-level metal lines comprising:

(1) a first portion having a substantially rectangular form;

(2) a second portion having a substantially rectangular form; and (3) a third portion coupled to said first portion and said second portion having a substantially rectangular form, wherein said third portion is disposed between said first portion and said second portion, and wherein said third portion includes:

(a) a main power supply line and a main ground line disposed substantially in parallel to at least one side of said first and second portions;

(b) a sub-power supply line connected to said main power supply line and disposed substantially perpendicularly to said main power supply line;

(c) a sub-ground line connected to said main ground line and disposed substantially perpendicularly to said main ground line; and (d) a plurality of logic gate circuits disposed between said sub-power supply line and said sub-ground line, wherein said sub-power supply line and said sub-ground line are formed of lower-level metal lines of said two-level metal lines, wherein said main power supply line and said main ground line are formed of diffusion lines, wherein a plurality of interconnect lines are provided to connect said logic gate circuits to one another and to said first and second portions, in a predetermined manner, for inputting and outputting signals to and from said logic gate circuits, wherein said interconnect lines are formed of other lower-level metal lines of said two-level metal lines disposed substantially perpendicularly to said main power supply lines and to said main ground line and formed of upper-level metal lines of said two-level metal lines disposed substantially in parallel to said main power supply line and to said main ground line, and wherein said logic gate circuits are connected to said sub-power supply line and said sub-ground line so that power for said logic gate circuits is supplied from said sub-power supply line and said sub-ground line.

7. A microprocessor using two-level metal lines comprising:

(1) a first portion having a substantially rectangular form;

(2) a second portion having a substantially rectangular form; and (3) a third portion coupled to said first portion and said second portion having a substantially rectangular form, wherein said third portion is disposed between said first portion and said second portion, and wherein said third portion includes:

(a) a main power supply line and a main ground line disposed substantially in parallel to at least one side of said first and second portions;

(b) a sub-power supply line connected to said main power supply line and disposed substantially perpendicularly to said main power supply line;

(c) a sub-ground line connected to said main ground line and disposed substantially perpendicularly to said main ground line; and (d) a plurality of logic gate circuits disposed between said sub-power supply line and said sub-ground line, wherein said sub-power supply line and said sub-ground line are formed of lower-level metal lines of said two-level metal lines, wherein said main power supply line and said main ground line are formed of diffusion lines or upper-level metal lines of said two-level metal lines, wherein a plurality of interconnect lines are provided to connect said logic gate circuits to one another and to said first and second portions, in a predetermined manner, for inputting and outputting signals to and from said logic gate circuits, wherein said interconnect lines are formed of other lower-level metal lines of said two-level metal lines disposed substantially perpendicularly to said main power supply lines and to said main ground line and formed of upper-level metal lines of said two-level metal lines disposed substantially in parallel to said main power supply line and to said main ground line, and wherein said logic gate circuits are connected to said sub-power supply line and said sub-ground line so that power for said logic gate circuits is supplied from said sub-power supply line and said sub-ground line.

8. A microprocessor using two-level metal lines comprising:

(1) a first portion having a substantially rectangular form;

(2) a second portion having a substantially rectangular form; and (3) a third portion coupled to said first portion and said second portion having a substantially rectangular form, wherein said third portion is disposed between said first portion and said second portion, and wherein said third portion includes:

(a) a first main power supply line and a first main ground line disposed substantially in parallel to one side of the substantially rectangular form of said first portion;

(b) a second main power supply line and a second main ground line disposed substantially in parallel to one side of the substantially rectangular form of said second portion;

(c) a sub-power supply line connected to said first main power supply line and said second main power supply line and disposed substantially perpendicularly to said first main power supply line and said second main power supply line;

(d) a sub-ground line connected to said first main ground line and said second main ground line and disposed substantially perpendicularly to said first main ground line and said second main ground line; and (e) a plurality of logic gate circuits disposed between said sub-power supply line and said sub-ground line, wherein said sub-power supply line and said sub-ground line are formed of lower metal lines of two-level metal lines, wherein said first main power supply line, said second main power supply line, said first main ground line, and said second main ground line are formed of diffusion lines or upper-level metal lines of said two-level metal lines, wherein a plurality of interconnect lines are provided to connect said logic gate circuits to one another and to said first and second portions, in a predetermined manner, for inputting and outputting signals to and from said logic gate circuits, wherein said interconnect lines are formed of other lower-level metal lines of said two-level metal lines disposed substantially perpendicularly to said main power supply lines and to said main ground line and formed of other upper-level metal lines of said two-level metal lines disposed substantially in parallel to said main power supply lines and to said main ground line, and wherein said logic gate circuits are connected to said sub-power supply line and said sub-ground line so that power for said logic gate circuits is supplied from said sub-power supply line and said sub-ground line.

9. A semiconductor logic integrated circuit chip using metal lines comprising:
(1) a first portion having a substantially rectangular form;
(2) a second portion having a substantially rectangular form; and
(3) a third portion coupled to said first portion and said second portion having a substantially rectangular form,
wherein said third portion is disposed between said first portion and said second portion, and
wherein said third portion includes:
(a) a main power supply line and a main ground line disposed substantially in parallel to at least one side of said first and second portions;
(b) a sub-power supply line connected to said main power supply line and disposed substantially perpendicularly to said main power supply line;
(c) a sub-ground line connected to said main ground line and disposed substantially perpendicularly to said main ground line; and
(d) a plurality of logic gate circuits,
wherein a plurality of interconnect lines are provided to connect said logic gate circuits to one another and to said first and second portions, in a predetermined manner, for inputting and outputting signals to and from said logic gate circuits,
wherein said logic gate circuits are connected to said sub-power supply line and said sub-ground line so that power of said logic gate circuits is supplied from said sub-power supply line and said sub-ground line, and
wherein said main power supply line and said main ground line are formed of diffusion lines.

10. A microprocessor using metal lines comprising:
(1) a first portion having a substantially rectangular form;
(2) a second portion having a substantially rectangular form; and
(3) a third portion coupled to said first portion and said second portion having a substantially rectangular form,
wherein said third portion is disposed between said first portion and said second portion, and
wherein said third portion includes:
(a) a main power supply line and a main ground line disposed substantially in parallel to at least one side of said first and second portions;
(b) a sub-power supply line connected to said main power supply line and disposed substantially perpendicularly to said main power supply line;
(c) a sub-ground line connected to said main ground line and disposed substantially perpendicularly to said main ground line; and
(d) a plurality of logic gate circuits,
wherein a plurality of interconnect lines are provided to connect said logic gate circuits to one another and to said first and second portions, in a predetermined manner, for inputting and outputting signals to and from said logic gate circuits,
wherein said logic gate circuits are connected to said sub-power supply line and said sub-ground line so that power of said logic gate circuits is supplied from said sub-power supply line and said sub-ground line.

11. A semiconductor integrated circuit microprocessor chip using two-level metal lines comprising:
(1) a memory portion for storing a microprogram therein and having a substantially rectangular form;
(2) an execution unit for executing an arithmetic operation and having a substantially rectangular form; and
(3) an execution unit controller coupled to said memory portion and said execution unit for generating control signals for said execution unit by decoding said microprogram stored in said memory portion and having a substantially rectangular form,
wherein said execution unit controller is disposed between said memory portion and said execution unit, and
wherein said execution unit controller includes:
(a) a first main power supply line and a first main ground line disposed substantially in parallel to one side of the substantially rectangular form of said memory portion;
(b) a second main power supply line and a second main ground line disposed substantially in parallel to one side of the substantially rectangular form of said execution unit;
(c) a sub-power supply line connected to said first main power supply line and said second main power supply line and disposed substantially perpendicularly to said first main power supply line and said second main power supply line;
(d) a sub-ground line connected to said first main ground line and said second main ground line and disposed substantially perpendicularly to said first main ground line and said second main ground line; and
(e) a plurality of logic gate circuits disposed between said sub-power supply line and said sub-ground line,
wherein said sub-power supply line and said sub-ground line are formed of lower metal lines of said two-level metal lines,
wherein said first main power supply line, said second main power supply line, said first main ground line, and said second main ground line are formed of diffusion lines or upper metal lines of said two-level metal lines,
wherein a plurality of interconnect lines are provided for connecting said logic gate circuits to one another and to said memory portion and said execution unit, in a predetermined manner, for inputting and outputting signals to and from said logic gate circuits,
wherein said interconnect lines are formed of other lower-level metal lines of said two-level metal lines disposed substantially perpendicularly to said main power supply lines and to said main ground line and formed of other upper metal lines of said two-level metal lines disposed substantially in parallel to said main power supply lines and to said main ground line, and wherein said logic gate circuits are connected to said sub-power supply line and said sub-ground line so that power for said logic gate circuits is supplied from said sub-power supply line and said sub-ground line.

12. A semiconductor integrated circuit microprocessor chip according to claim 11, wherein said execution unit controller is formed of random logic circuits.

13. A semiconductor logic integrated circuit chip using two-level metal lines, wherein said chip includes a logic circuit which receives information comprising an instruction and which generates a control signal for executing said instruction, and wherein said logic circuit has a substantially rectangular form, and receives said instruction information substantially through one long side of said rectangular form, and generates said control signal substantially through another long side of said rectangular form, wherein said logic circuit includes:
(a) a first main power supply line and a first main ground line disposed substantially in parallel to one side of the substantially rectangular form of said logic circuit;
(b) a second main power supply line and a second main ground line disposed substantially in parallel to one side of the substantially rectangular form of said logic circuit;
(c) a sub-power supply line connected to said first main power supply line and said second main power supply line and disposed substantially perpendicularly to said first main power supply line and said second main power supply line;
(d) a sub-ground line connected to said first main ground line and said second main ground line and disposed substantially perpendicularly to said first main ground line and said second main ground line; and
(e) a plurality of logic gate circuits disposed between said sub-power supply line and said sub-ground line, wherein said sub-power supply line and said sub-ground line are formed of lower-level metal lines of said two-level metal lines, wherein said first main power supply line, said second main power supply line, said first main ground line, and said second main ground line are formed of diffusion lines, wherein a plurality of interconnect lines are provided for connecting said logic gate circuits to one another and for providing said information as an input to said logic gate circuits and for carrying said control signals as an output of said logic gate circuits, wherein said interconnect lines are formed of other lower-level metal lines of said two-level metal lines disposed substantially perpendicularly to said main power supply lines and to said main ground lines and formed of upper-level metal lines of said two-level metal lines disposed substantially in parallel to said main power supply lines and to said main ground lines, and wherein said logic gate circuits are connected to said sub-power supply line and said sub-ground line so that power for said logic gate circuits is supplied from said sub-power supply line and said sub-ground line.

14. A semiconductor logic integrated circuit chip according to claim 13, wherein said logic circuit receives said instruction information from a memory means for storing a microprogram therein.

15. A semiconductor logic integrated circuit chip according to claim 13, wherein said logic circuit generates said control signal to an execution means for executing an arithmetic or logical operation.

16. A semiconductor logic integrated circuit chip using two-level metal lines, said chip including a logic circuit which receives information comprising an instruction and generates a control signal for executing said instruction, wherein said logic circuit has a substantially rectangular form, and receives said instruction information substantially through one long side of said rectangular form, and generates said control signal substantially through another long side of said rectangular form, and wherein said logic circuit includes:
(a) a main power supply line and a main ground line disposed substantially in parallel to one side of the substantially rectangular form of said logic circuit;
(b) a sub-power supply line connected to said first main power supply line and disposed substantially perpendicularly to said main power supply line;
(c) a sub-ground line connected to said main ground line and disposed substantially perpendicularly to said main ground line; and
(d) a plurality of logic gate circuits, wherein a plurality of interconnect lines are provided for connecting said logic gate circuits to one another and for providing said information as an input to said logic gate circuits and for carrying said control signals as an output of said logic gate circuits, wherein said interconnect lines are comprised of lines disposed substantially perpendicularly to said main power supply line and to said main ground line and comprised of lines disposed substantially in parallel to said main power supply line and to said main ground line, wherein said interconnect lines disposed substantially perpendicularly to either said main power supply line or said main ground line are comprised of lower-level lines of said two-level metal lines, wherein said lines disposed substantially in parallel to one of said main power supply line and said main ground line are formed of diffusion lines, and wherein said logic gate circuits are connected to said sub-power supply line and said sub-ground line so that power for said logic gate circuits is supplied from said sub-power supply line and said sub-ground line.

17. A semiconductor logic integrated circuit chip according to claim 16, wherein said plurality of logic gate circuits are disposed between said sub-power supply line and said sub-ground line.

18. A semiconductor integrated circuit microprocessor chip according to claim 11, wherein said first main power supply line, said second main power supply line, said first main ground line, and said second main ground line are formed of said upper-level metal lines of said two-level metal lines.

19. A semiconductor integrated circuit microprocessor chip according to claim 11, wherein said first main power supply line, said second main power supply line, said first main ground line, and said second main ground line are formed of said diffusion lines.

20. A semiconductor logic integrated circuit chip according to claim 13, wherein said semiconductor logic integrated circuit chip is a microprocessor.

21. A semiconductor logic integrated circuit chip according to claim 16, wherein said semiconductor logic integrated circuit chip is a microprocessor.

* * * * *